United States Patent
Maeda et al.

(10) Patent No.: US 10,109,452 B2
(45) Date of Patent: Oct. 23, 2018

(54) SUBSTRATE PROCESSING SYSTEM, GATE VALVE AND SUBSTRATE TRANSFER METHOD

(71) Applicant: TOKYO ELECTRON LIMITED, Tokyo (JP)

(72) Inventors: Kouji Maeda, Nirasaki (JP); Naoyuki Suzuki, Nirasaki (JP); Tetsuya Miyashita, Nirasaki (JP); Masamichi Hara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 519 days.

(21) Appl. No.: 14/735,216

(22) Filed: Jun. 10, 2015

(65) Prior Publication Data
US 2015/0371812 A1 Dec. 24, 2015

(30) Foreign Application Priority Data
Jun. 19, 2014 (JP) .................. 2014-126557

(51) Int. Cl.
| | |
|---|---|
| *H01J 37/18* | (2006.01) |
| *H01J 37/32* | (2006.01) |
| *H01L 21/67* | (2006.01) |
| *H01L 21/677* | (2006.01) |
| *H01J 37/317* | (2006.01) |

(52) U.S. Cl.
CPC ........ *H01J 37/185* (2013.01); *H01J 37/3178* (2013.01); *H01J 37/32513* (2013.01); *H01J 37/32733* (2013.01); *H01J 37/32899* (2013.01); *H01L 21/67126* (2013.01); *H01L 21/67184* (2013.01); *H01L 21/67748* (2013.01)

(58) Field of Classification Search
CPC .................................................. H01J 37/32513
See application file for complete search history.

(56) References Cited

U.S. PATENT DOCUMENTS

2013/0309047 A1* 11/2013 Wakabayashi .... H01L 21/67126
414/217

FOREIGN PATENT DOCUMENTS

| | | |
|---|---|---|
| JP | H10242234 A | 9/1998 |
| JP | 2007149973 A | 6/2007 |
| WO | 2012108439 A1 | 8/2012 |

* cited by examiner

*Primary Examiner* — Parviz Hassanzadeh
*Assistant Examiner* — Nathan K Ford
(74) *Attorney, Agent, or Firm* — Nath Goldberg & Meyer; Jerald L Meyer (57) ABSTRACT

There is provided a substrate processing system which includes: at least two transfer chambers disposed adjacent each other, each of which including a transfer mechanism configured to transfer a substrate; at least one process chamber connected to each of the at least two transfer chambers, and configured to perform a process on the substrate loaded into the at least one process chamber; a gate valve configured to move into and out of a connection path interconnecting the at least two transfer chambers and configured to separate the at least two transfer chambers from each other; and a substrate holding mechanism attached to the gate valve and configured to hold the substrate.

6 Claims, 9 Drawing Sheets

SUBSTRATE PROCESSING SYSTEM, GATE VALVE AND SUBSTRATE TRANSFER METHOD

CROSS-REFERENCE TO RELATED APPLICATION

This application claims the benefit of Japanese Patent Application No. 2014-126557, filed on Jun. 19, 2014, in the Japan Patent Office, the disclosure of which is incorporated herein in its entirety by reference.

TECHNICAL FIELD

The present disclosure relates to a substrate processing system, a gate valve and a substrate transfer method.

BACKGROUND

When forming an electronic device on a substrate, e.g., a semiconductor wafer (hereinafter simply referred to as "wafer"), the number of vacuum processes (e.g., plasma etching processes), which is applied to the wafer, is increased as a structure of the electronic device becomes complex and dense. The respective vacuum processes are performed in process modules (uses as process chambers) installed in a substrate processing system. The respective process modules are disposed so as to surround a respective transfer module (used as a wafer transfer chamber). At this time, the wafer can be subjected to the vacuum processes by carrying the wafer into and out of the respective process modules.

There is known a substrate processing system in which the number of process modules, which a wafer can be carried into and out of, is increased by interconnecting a plurality of transfer modules. In such a substrate processing system, the wafer is subjected to a multiple number of vacuum processes by a large number of process modules. When delivering the wafer between adjoining transfer modules, a transfer arm of one transfer module mounts the wafer on a stage disposed near a gate valve which partitions the adjoining transfer modules. Thereafter, a transfer arm of another adjacent transfer module receives the mounted wafer from the stage.

However, in order for the transfer arm to mount the wafer on the stage or to receive the wafer from the stage, there is a need to move the transfer arm or the stage in a vertical direction. That is to say, it is necessary to employ not only an expansion/contraction mechanism and a swivel mechanism for moving the transfer arm in a horizontal direction but also a mechanism for moving the transfer arm and the stage in the vertical direction. This complicates a structure of the substrate processing system.

SUMMARY

Some embodiments of the present disclosure provide to a substrate processing system, a gate valve and a substrate transfer method, which are capable of simplifying a structure of the substrate processing system.

According to one embodiment of the present disclosure, there is provided a substrate processing system which includes: at least two transfer chambers disposed adjacent each other, each of which including a transfer mechanism configured to transfer a substrate; at least one process chamber connected to each of the at least two transfer chambers, and configured to perform a process on the substrate loaded into the at least one process chamber; a gate valve configured to move into and out of a connection path interconnecting the at least two transfer chambers and configured to separate the at least two transfer chambers from each other; and a substrate holding mechanism attached to the gate valve and configured to hold the substrate.

According to another embodiment of the present disclosure, there is provided a gate valve for use in a substrate processing system which includes at least two transfer chambers disposed adjacent each other and at least one process chamber connected to each of the at least two transfer chambers, and configured to perform a process on a substrate loaded into the at least one process chamber, each of the at least two transfer chambers including a transfer mechanism configured to transfer the substrate, the gate valve being configured to move into and out of a connection path interconnecting the at least two transfer chambers and configured to separate the at least two transfer chambers from each other, the gate valve including a substrate holding mechanism configured to hold the substrate.

According to another embodiment of the present disclosure, there is provided a substrate transfer method for use in a substrate processing system, wherein the substrate processing system includes: at least two transfer chambers disposed adjacent each other, each of which including a transfer mechanism configured to transfer a substrate; at least one process chamber connected to each of the at least two transfer chambers, and configured to perform a process on the substrate loaded into the at least one process chamber; a gate valve configured to move into or out of a connection path interconnecting the at least two transfer chambers and configured to separate the at least two transfer chambers from each other; and a substrate holding mechanism attached to the gate valve and configured to hold the substrate, the method including: moving the gate valve out of the connection path; transferring the substrate between the at least two transfer chambers disposed adjacent to each other by cooperation between a movement of the substrate holding mechanism along with the movement of the gate valve and a transfer operation of the transfer mechanism; and moving the gate valve into the connection path.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
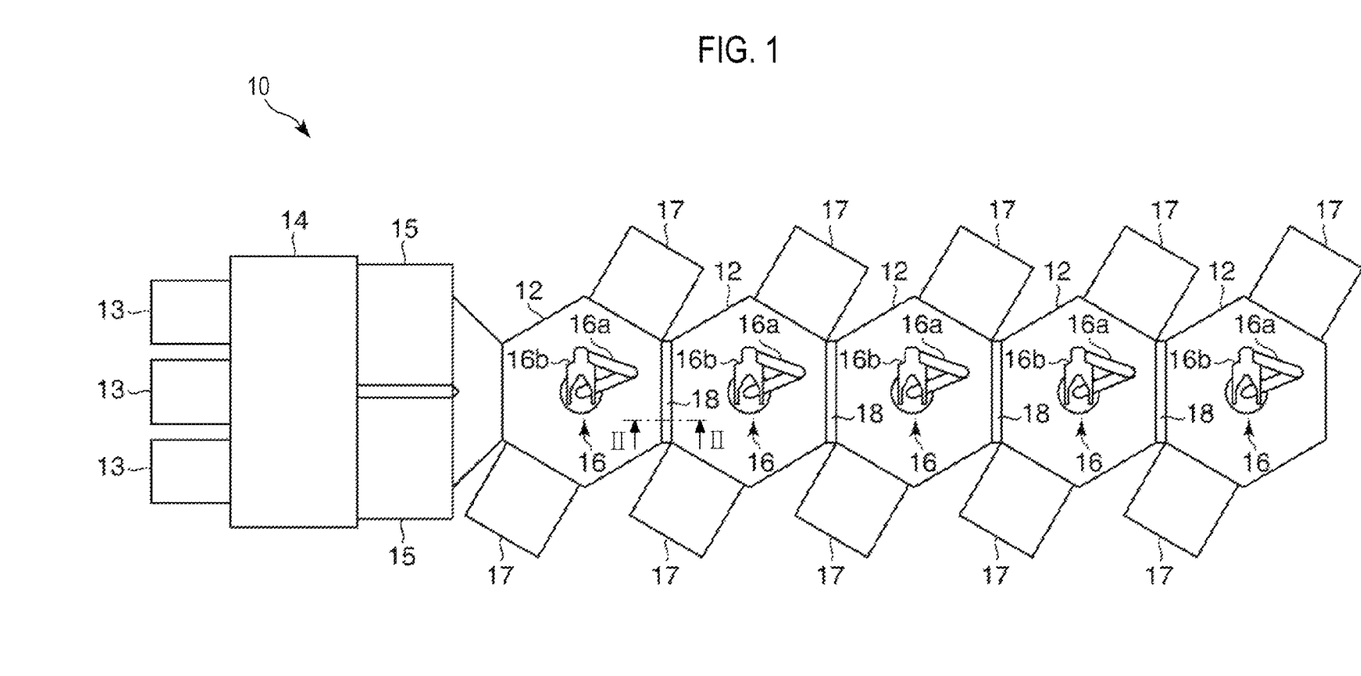
FIG. 1 is a plan view schematically showing a configuration of a substrate processing system according to one embodiment of the present disclosure.

FIG. 1 is a plan view schematically showing a configuration of a substrate processing system according to one embodiment of the present disclosure. For the sake of easier understanding, FIG. 1 is drawn such that some internal structures are seen through.

Referring to FIG. 1, a substrate processing system 10 includes five transfer modules 12 (uses as transfer chambers) arranged in tandem and connected to one another, a loader module 14 (an EFEM) to which a plurality of carriers 13 (used as containers) for accommodating a plurality of wafers is connected, and two load lock modules 15 configured to interconnect the transfer module 12 and the loader module 14.

Each of the five transfer modules 12 includes a scalar-arm-type transfer arm 16 (used as a transfer mechanism) installed therein. The interior of each of the five transfer modules 12 is depressurized. Further, each of the five transfer modules 12 is connected to two process modules 17 (used as process chambers). The interior of each of the process modules 17 is depressurized. Each of the process modules 17 performs various kinds of vacuum processes, e.g., a plasma etching process, a CVD (Chemical Vapor Deposition) process and a PVD (Physical Vapor Deposition) process, on the wafer loaded into each of the process modules 17.

The transfer arm 16 is configured such that it can expand and contract in a horizontal direction within each of the transfer modules 12 and can swivel on a horizontal plane. The transfer arm 16 includes an expansion/contraction arm 16a and a pick 16b as a bifurcated fork-shaped member installed at the tip of the arm 16a. The transfer arm 16 is configured to hold and transfer the wafer with the pick 16b. The transfer arm 16 is configured to carry the wafer into or out of the respective process modules 17. Further, the transfer arm 16 of one transfer module 12 transfers the wafer between itself and the transfer arm 16 of another adjacent transfer module 12. In this embodiment, the transfer arms 16 are not moved in a vertical direction.

The interior of the loader module 14 is kept at an atmospheric pressure. The loader module 14 includes a transfer arm (not shown) installed in the loader module 14. The transfer arm of the loader module 14 transfers the wafer between the carriers 13 and the load lock modules 15.

Each of the load lock modules 15 is configured such that the internal pressure of each of the load lock modules 15 can be switched to an atmospheric pressure or a vacuum. Each of the load lock modules 15 is provided with a stage (not shown) capable of mounting the wafer thereon. When the interior of the load lock module 15 is depressurized to a vacuum, the transfer arm 16 of the transfer module 12 disposed adjacent to the load lock module 15 moves into the load lock module 15 to mount the wafer on the stage or to receive the wafer from the stage. Furthermore, when the interior of the load lock module 15 is pressurized to an atmospheric pressure, the transfer arm of the loader module 14 moves into the load lock module 15 to mount the wafer on the stage or to receive the wafer from the stage. Thus, the transfer of the wafer between the loader module 14 and the transfer module 12 is performed through the respective load lock modules 15.

In the substrate processing system 10, the wafer is carried into and out of each of the process modules 17 via the respective transfer modules 12. Thus, the wafer is subjected to a large number of vacuum processes such that an electronic device is formed on the wafer.

Figure 2A:
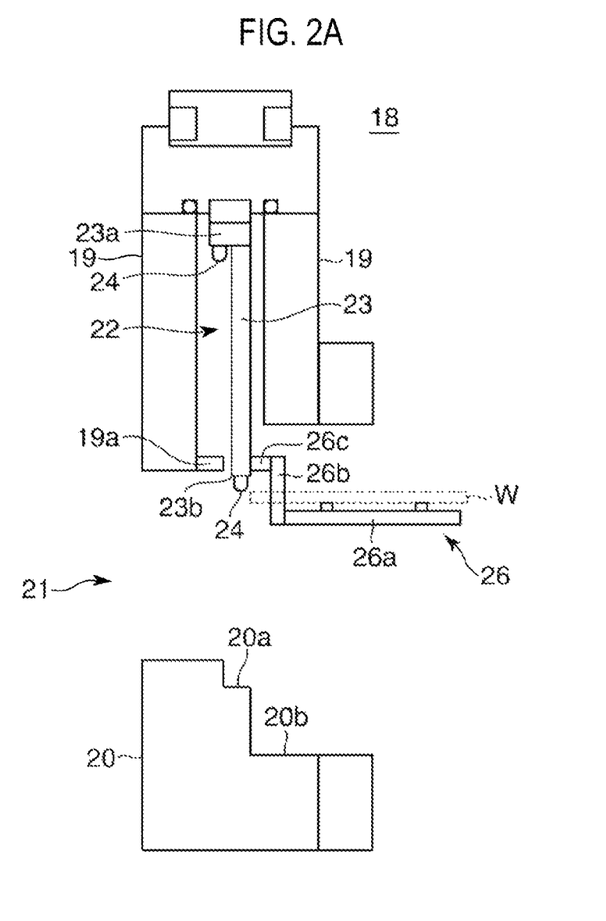
FIGS. 2A and 2B are views schematically showing a configuration of a junction part where one transfer module is joined to another adjacent transfer module, FIG. 2A being a sectional view taken along line II-II in FIG. 1 and FIG. 2B being a plan view of a wafer holding unit shown in FIG. 2A.
Figure 2B:
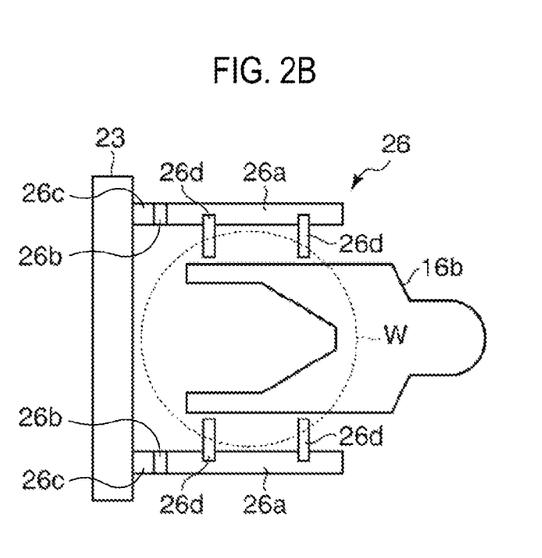

FIGS. 2A and 2B are views schematically showing a configuration of a junction part 18 where one transfer module is joined to another adjacent transfer module. FIG. 2A is a sectional view taken along line II-II in FIG. 1. FIG. 2B is a plan view of a wafer holding unit shown in FIG. 2A. In FIG. 2A, the vertical direction coincides with the up-down direction of the drawing.

As shown in FIG. 2A, an upper frame 19 and a lower frame 20 of the transfer module 12 are disposed in the junction part 18 where one transfer module 12 is joined to another adjacent transfer module 12. The upper frame 19 and the lower frame 20 are spaced apart from each other in the up-down direction. A connection path 21 through which the interior of one transfer module 12 is in communication with the interior of another adjacent transfer module 12, is formed between the upper frame 19 and the lower frame 20.

A gate valve accommodating space 22 extending along the up-down direction is formed in the upper frame 19. The gate valve accommodating space 22 accommodates a plate-shaped gate valve (partition valve) 23 which is disposed to extend in the up-down direction. The gate valve 23 has an inverted L-like cross-sectional shape. On a lower surface of a horizontally-protruding flange portion 23a of a top portion of the gate valve 23 and at a lower end of the gate valve 23, seal rings 24 are arranged so as to surround the gate valve 23. The gate valve 23 can be moved in the up-down direction by a drive unit (a motor, an air cylinder, etc.) not shown. The gate valve 23 is configured to move into and out of the connection path 21.

When the gate valve 23 moves downward from the gate valve accommodating space 22 in FIG. 2A, the seal ring 24 installed in the lower end 23b of the gate valve 23 is brought into contact with a stepped surface 20a of the lower frame 20 while the seal ring 24 installed in the flange portion 23a is brought into contact with a flange portion 19a horizontally protruding from the lower end of the upper frame 19 toward the gate valve accommodating space 22. Thus, the connection path 21 is closed by the gate valve 23 so that the interior of one transfer module 12 and the interior of another adjacent transfer module 12 are isolated from each other.

A wafer holding frame 26 (used as a substrate holding mechanism) is installed in the vicinity of the lower end of the gate valve 23. As shown in FIG. 2A, the wafer holding frame 26 has an L-like shape when seen in a side view. The wafer holding frame 26 includes two arms 26a horizontally protruding toward the interior of another adjacent transfer module 12, and two members 26b respectively connected to the respective arms 26a and arranged to extend along the up-down direction. The members 26b are connected to the lower end of the gate valve 23 via respective projection portions 26c.

As shown in FIG. 2B, the two arms 26a of the wafer holding frame 26 are arranged in a horizontally spaced-apart parallel relationship with each other. Two rod-shaped lifters 26d are installed to protrude from one arm 26a toward the other arm 26a. The distance between the lifters 26d facing each other is larger than a horizontal width of the pick 16b of the transfer arm 16. Thus, the pick 16b can be positioned between the two arms 26a without interfering with the lifters 26d. Furthermore, the distance between the lifters 26d facing each other is set to smaller than the diameter of a wafer W (indicated by a broken line in FIGS. 2A and 2B). With this configuration, the respective lifters 26d can make contact with an edge portion of the wafer W from below, thus supporting the wafer W. In some embodiments, suction mechanisms may be installed on lower surfaces of the respective lifters 26d such that the wafer W can be suspended by allowing the respective lifters 26d to suck the edge portion of the wafer W from above.

As shown in FIG. 2A, the wafer holding frame 26 is configured to protrudes more downward than the lower end 23b of the gate valve 23. Therefore, closing of the connection path 21 by the gate valve 23 may result in interference of the wafer holding frame 26 with the lower frame 20. In this embodiment, in view of this circumstance, an escape portion 20b is formed in the lower frame 20. Thus, when the gate valve 23 closes the connection path 21, the wafer holding frame 26 stays in the escape portion 20b and does not interfere with the lower frame 20.

FIGS. 3A to 3H are process diagrams showing a substrate transfer method according to another embodiment. The term "up-down direction" used below in describing the substrate transfer method coincides with the up-down direction of the drawings.

First, the wafer holding frame 26 is moved up by moving the gate valve 23 upward from a position (closing position) where the gate valve 23 closes the connection path 21. Thus, the wafer holding frame 26 is moved to an arm avoiding position. The arm avoiding position refers to a position where the wafer holding frame 26 can avoid the transfer arm 16 which enters into a vertically movable range (hereinafter referred to as "frame movable range") of the wafer holding frame 26. In this embodiment, the arm avoiding position is set below the transfer arm 16 entering into the frame movable range (the position of the wafer holding frame 26 in FIG. 3A). Thereafter, the transfer arm 16 (hereinafter referred to as "delivery-side transfer arm 16") of one transfer module 12 carrying the wafer W mounted on the pick 16b is moved into the frame movable range. When the pick 16b is positioned above the respective lifters 26d of the wafer holding frame 26, the delivery-side transfer arm 16 is stopped (see FIG. 3B).

Figure 3A:
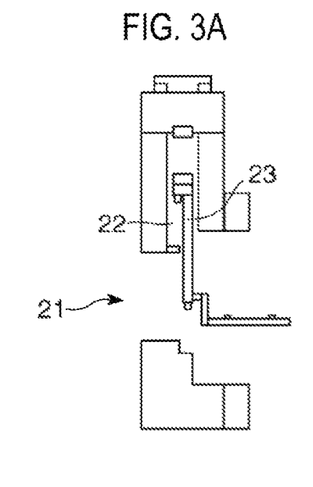
FIGS. 3A to 3H are process diagrams showing a substrate transfer method according to another embodiment.
Figure 3B:
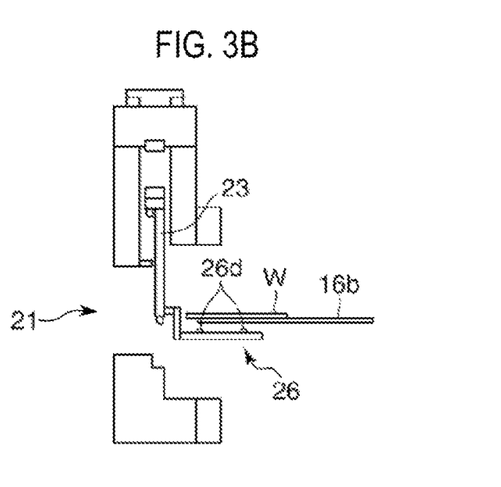
Figure 3C:
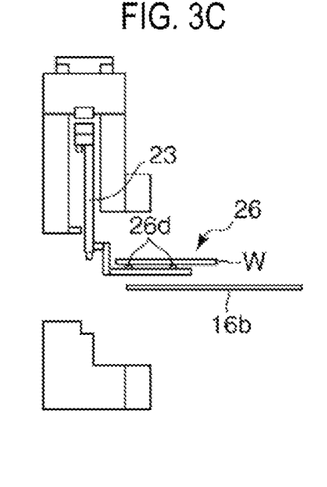
Figure 3D:
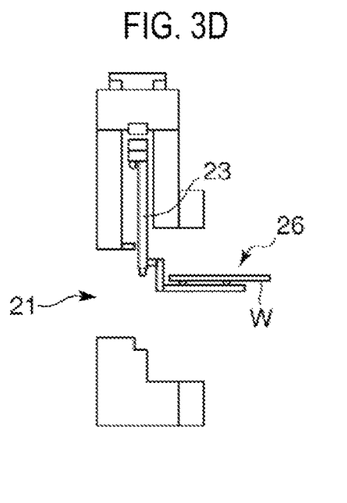

Thereafter, the gate valve 23 is moved upward. Along with this movement of the gate valve 23, the wafer holding frame 26 is also moved upward. During the upward movement of the wafer holding frame 26, the respective lifters 26d is brought into contact with the edge portion of the wafer W from below. The wafer holding frame 26 continues to move upward so that the respective lifters 26d move upward while supporting the wafer W. Thus, the wafer W is moved away from the pick 16b. In this way, the wafer W mounted on the pick 16b of the delivery-side transfer arm 16 is delivered to the respective lifters 26d. In this embodiment, a position where the wafer holding frame 26 and the pick 16b are located when the respective lifters 26d is brought into contact with the edge position of the wafer W from below will be referred to as a "wafer delivery position".

Subsequently, when the wafer holding frame 26 is moved to a position located above the pick 16b of the delivery-side transfer arm 16 and spaced apart a predetermined distance from the delivery-side transfer arm 16, the gate valve 23 stops the upward movement. The upward movement of the wafer holding frame 26 is also stopped (see FIG. 3C). Thereafter, the delivery-side transfer arm 16 is moved out of the frame movable range (see FIG. 3D).

Subsequently, the transfer arm 16 (hereinafter referred to as "reception-side transfer arm 16") of another adjacent transfer module 12 enters into the frame movable range. When the pick 16b of the reception-side transfer arm 16 is positioned below the wafer W supported on the respective lifters 26d of the wafer holding frame 26, the reception-side transfer arm 16 is stopped (see FIG. 3E).

Figure 3E:
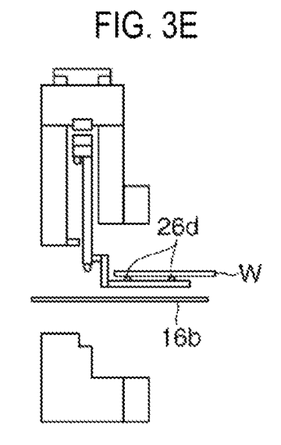
Figure 3F:
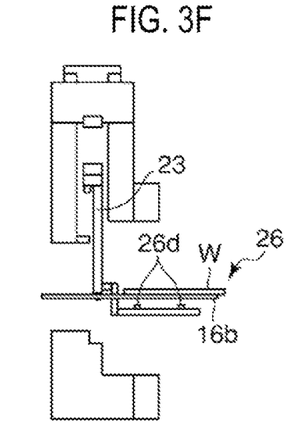
Figure 3G:
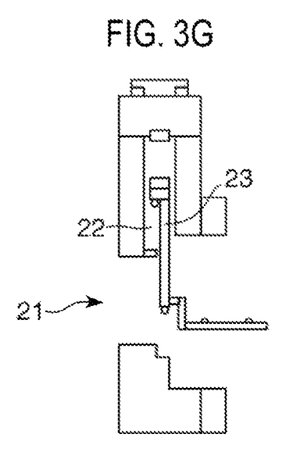
Figure 3H:
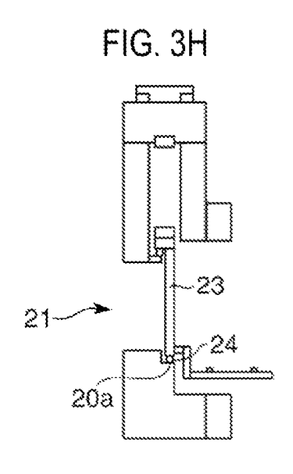

Then, the gate valve 23 is moved downward. Along with this movement of the gate valve 23, the wafer holding frame 26 is also moved downward. During the downward movement of the wafer holding frame 26, the pick 16b is brought into contact with the wafer W from below. The wafer holding frame 26 continues to move downward. Thus, the wafer W is moved away from the respective lifters 26d and is mounted on the pick 16b of the reception-side transfer arm 16. In this embodiment, the vertical position of the reception-side transfer arm 16 is identical with that of the delivery-side transfer arm 16. Further, both the reception-side transfer arm 16 and the delivery-side transfer arm 16 are configured to not move in the up-down direction. Therefore, the vertical positions of the picks 16b of the reception-side transfer arm 16 and the delivery-side transfer arm 16 remain the same. Accordingly, the pick 16b of the reception-side transfer arm 16 receives the wafer W from the respective lifters 26d at the wafer delivery position.

Subsequently, when the wafer holding frame 26 is moved to the arm avoiding position, the gate valve 23 stops the downward movement. As a result, the downward movement of the wafer holding frame 26 is also stopped (see FIG. 3F). Thereafter, the reception-side transfer arm 16 is moved out of the frame movable range (see FIG. 3G).

Thereafter, the downward movement of the gate valve 23 is resumed after the reception-side transfer arm 16 is moved out of the frame movable range. The gate valve 23 is moved to the position (the closing position) where the seal ring 24 of the lower end 23b is brought into contact with the stepped surface 20a of the lower frame 20 to close the connection path 21. In this way, the transfer process of this embodiment is completed (see FIG. 3H).

According to the substrate processing system 10 shown in FIG. 1, the wafer holding frame 26 which supports the wafer W is attached to the gate valve 23 capable of moving into and out of the connection path 21 which interconnects two adjacent transfer modules 12. Thus, the wafer holding frame 26 can be moved in the up-down direction by moving the gate valve 23 in the up-down direction across the connection path 21. As described above, the transfer of the wafer W between the two adjacent transfer modules 12 is performed by cooperation between the up-down movement of the wafer holding frame 26 and expansion/contraction operations of the delivery-side transfer arm 16 and the reception-side transfer arm 16, specifically by cooperation between the entry of the delivery-side transfer arm 16 into the frame movable range and the upward movement of the wafer holding frame 26 and by cooperation between the entry of the reception-side transfer arm 16 into the frame movable range and the downward movement of the wafer holding frame 26. Therefore, there is no need to install a drive unit for the wafer holding frame 26 in addition to the drive unit for the gate valve 23. This simplifies a structure of the substrate processing system 10.

Figure 4:
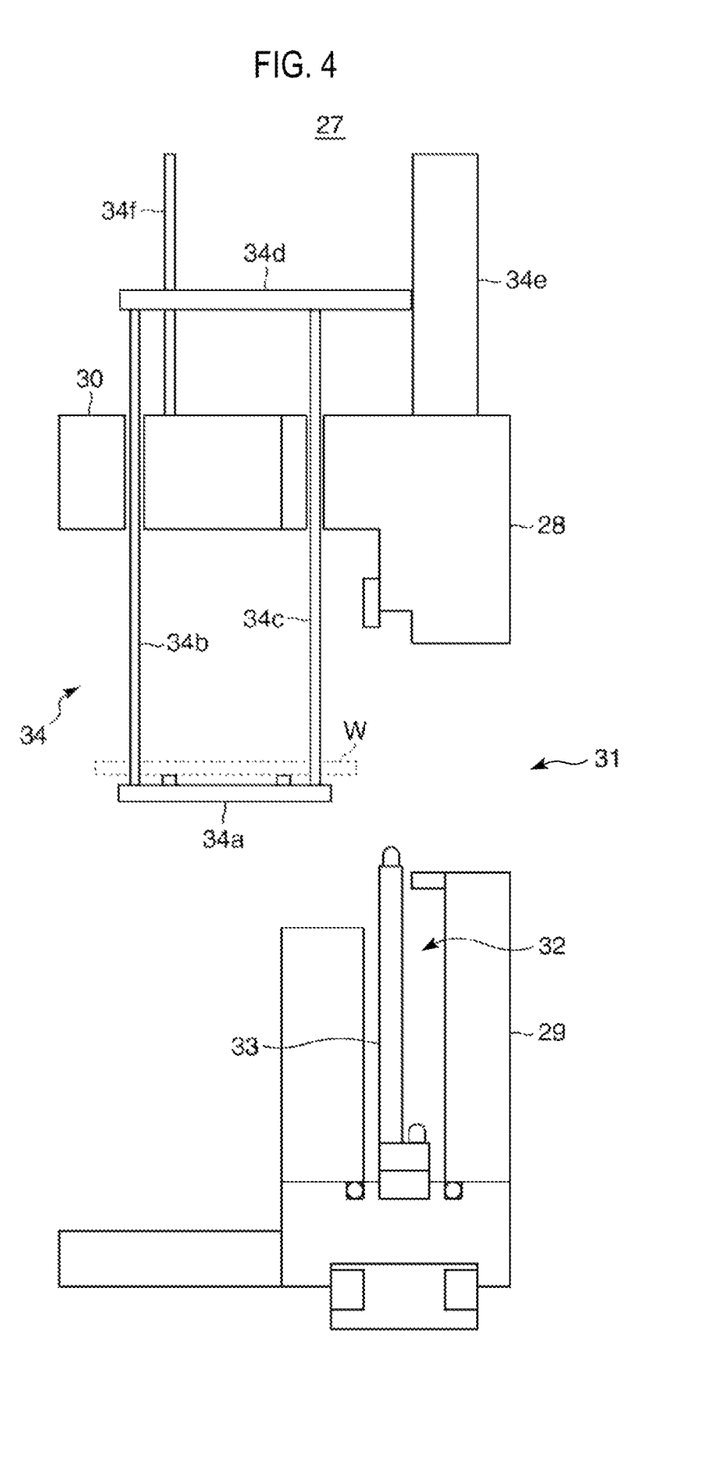
FIG. 4 is a sectional view schematically showing a configuration of a junction part in which a wafer holding frame and a gate valve are installed independently of each other, according to another embodiment of the present disclosure.

In some embodiments, a wafer holding frame and a gate valve may be independently installed instead of attaching the wafer holding frame 26 to the gate valve 23. FIG. 4 is a sectional view schematically showing a configuration of a junction part in which a wafer holding frame and a gate valve are installed independently of each other in accordance with another embodiment of the present disclosure.

As shown in FIG. 4, an upper frame 28 and a lower frame 29 of one transfer module 12 and an upper frame 30 of another adjacent transfer module 12 are disposed in a junction part 27 where one transfer module 12 is joined to another adjacent transfer module 12. The upper frame 28 and the lower frame 29 are spaced apart from each other in the up-down direction. A connection path 31 is formed between the upper frame 28 and the lower frame 29.

A gate valve accommodating space 32 extending along the up-down direction is formed in the lower frame 29. The gate valve accommodating space 32 accommodates a gate valve 33. The gate valve 33 can be moved in the up-down direction by a drive unit (a motor, an air cylinder, etc.) not shown. The gate valve 33 is configured to move into and out of the connection path 31. When the gate valve 33 moves upward from the gate valve accommodating space 32 in FIG. 4, the connection path 31 is closed by the gate valve 33.

In the junction part 27, a wafer holding frame 34 is attached to the upper frame 28 and the upper frame 30. The wafer holding frame 34 includes: an arm 34a positioned in the connection path 31 so as to mount a wafer W thereon; two rods 34b and 34c configured to support the arm 34a from above in a suspended state; a member 34d configured to interconnect the two rods 34b and 34c at the upper side of the upper frame 28 and the upper frame 30; a motor 34e disposed in a top portion of the upper frame 28 and configured to move the member 34d in the up-down direction; and a guide bar 34f extending upward from the upper frame 30 so as to guide the member 34d in the up-down direction.

According to the junction part 27 configured as above, the wafer W can be transferred between two adjacent transfer modules 12 by cooperation between expansion/contraction operations of the delivery-side transfer arm 16 and the reception-side transfer arm 16 and up-down movement of the arm 34a of the wafer holding frame 34.

However, in the junction part 27, the motor 34e needs to be installed independently of the drive unit of the gate valve 33 in order to realize the up-down movement of the arm 34a. This complicates a structure of a substrate processing system including the junction part 27 configured as above. Furthermore, the motor 34e is installed in the upper frame 28 while the guide bar 34f is installed in the upper frame 30. As such, if the upper frame 28 and the upper frame 30 are shifted from each other in the up-down direction, the guide bar 34f falls with respect to the motor 34, thus preventing the member 34d from being smoothly moved in the up-down direction. When delivering the wafer W, the wafer W needs to be kept horizontal in order to realize smooth delivery of the wafer W and to realize a suitable vacuum process for the delivered wafer W in each of the process modules 17. However, if the guide bar 34f falls, it is difficult to keep the member 34d horizontal. This makes it difficult to keep horizontal the wafer W mounted on the arm 34a.

In contrast, in the substrate processing system 10 shown in FIG. 1, as described above, there is no need to install a drive unit for the wafer holding frame 26 in addition to the drive unit for the gate valve 23. This simplifies the structure of the substrate processing system 10. Thus, the substrate processing system 10 is more advantageous than the substrate processing system provided with the junction part 27. Furthermore, in the substrate processing system 10 shown in FIG. 1, the wafer holding frame 26 is attached to only the gate valve 23. Therefore, for example, even if the drive unit for the gate valve 23 is inclined, the smooth up-down movement of the wafer holding frame 26 is not hindered as long as the gate valve 23 can be moved in the up-down direction. Thus, the substrate processing system 10 is more advantageous than the substrate processing system provided with the junction part 27.

Next, a description will be made on a substrate processing system according to another embodiment of the present disclosure.

This embodiment is essentially identical in configuration and operation with the above embodiment described above, and a duplicate description thereof will be omitted. Only the differing configurations and operations will be described below.

In recent years, a device which makes use of a magnetic film, e.g., a hard disk head which includes an MTJ (Magnetic Tunneling Junction) element has been put to a practical use. When a magnetic film is formed by a sputtering method or the like, in order to control the orientation of magnetic fields of the magnetic film, it is sometimes necessary to generate magnetic fields within a process module and to make sure that the magnetic fields generated within the process module intersect the magnetic fields of the magnetic film at a predetermined angle. That is to say, prior to putting the wafer W into the process module 17 in which magnetic fields are generated, the orientation of the magnetic fields of the magnetic film formed on the wafer W needs to be adjusted by rotating the wafer W within a horizontal plane. In these embodiments, in order to comply with such a need, the wafer W is rotated by a predetermined rotation angle within a horizontal plane when transferring the wafer W between two adjacent transfer modules 12.

Figure 5A:
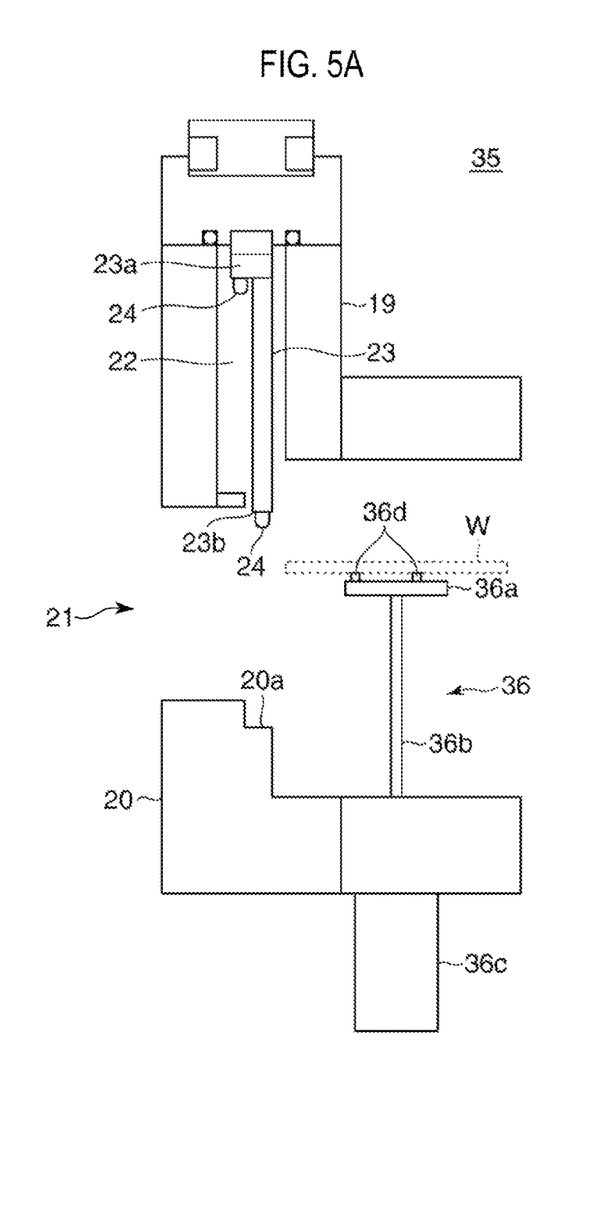
FIGS. 5A and 5B are views schematically showing a configuration of a junction part where one transfer module of a substrate processing system according to another embodiment of the present disclosure is joined to another adjacent transfer module, FIG. 5A being a sectional view of the junction part and FIG. 5B being a plan view of a wafer holding unit shown in FIG. 5A.
Figure 5B:
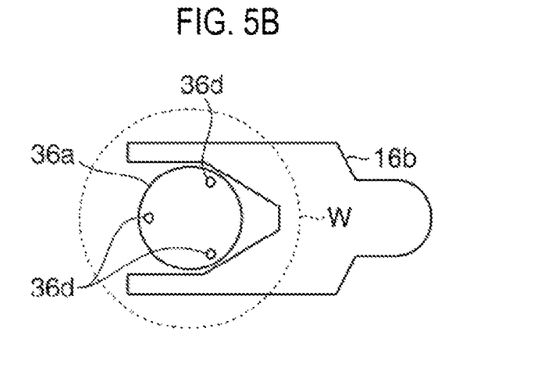

FIGS. 5A and 5B are views schematically showing a configuration of another junction part where one transfer module is joined to another adjacent transfer module in a substrate processing system according to another embodiment. FIG. 5A is a sectional view of the junction part. FIG. 5B is a plan view of a wafer holding unit shown in FIG. 5A. The vertical direction in FIG. 5A coincides with the up-down direction in the drawing.

As shown in FIG. 5A, the upper frame 19 and the lower frame 20 are disposed in a junction part 35 where one transfer module 12 is joined to another adjacent transfer module 12. The connection path 21 is formed between the upper frame 19 and the lower frame 20.

In the junction part 35, a wafer buffer 36 is disposed in the lower frame 20. The wafer buffer 36 includes: a disc-shaped stage 36a horizontally positioned in the connection path 21; a rod-shaped shaft 36b installed upright on the lower frame 20 and connected to the center of a rear surface of the stage 36a; a motor 36c installed in the lower portion of the lower frame 20 and configured to rotate the shaft 36b about a center axis; and three projection pins 36d circumferentially disposed on an upper surface of the stage 36a at regular intervals. In some embodiments, the motor 36c is configured to move the shaft 36b in the up-down direction.

As shown in FIG. 5B, the diameter of the stage 36a is smaller than the inner gap between bifurcated portions of the fork-shape pick 16b. Thus, the stage 36a can be positioned between the bifurcated portions of the pick 16b without interfering with the bifurcated portions of the pick 16b. Furthermore, the diameter of the circumference along which the three projection pins 36d are disposed is set smaller than the diameter of the wafer W (indicated by a broken line in FIGS. 5A and 5B). This enables the respective pins 36d to make contact with the wafer W from below and to support the wafer W.

In the wafer buffer 36, the motor 36c rotates the shaft 36b, thereby rotating the stage 36a within a horizontal plane. Thus, the wafer W supported by the respective pins 36d of the stage 36a can be rotated by a desired rotation angle within the horizontal plane. In some embodiments, a camera (not shown) may be installed in the upper frame 19 while facing the stage 36a, thereby monitoring the rotation angle of the wafer W.

FIGS. 6A to 6H are process diagrams showing a substrate transfer method according to another embodiment of the present disclosure. The term "up-down direction" used below in describing the substrate transfer method coincides with the up-down direction of the drawings.

First, the gate valve 23 is moved out of the connection path 21 and is accommodated in the gate valve accommodating space 22. Then, the interior of one transfer module 12 is in communication with the interior of another adjacent transfer module 12 through the connection path 21. At this time, the motor 36c moves the shaft 36b downward to dispose the stage 36a near the lower frame 20 (see FIG. 6A).

Subsequently, the motor 36c moves the shaft 36b upward to move the stage 36a to an arm avoiding position. The arm avoiding position refers to a position where the wafer buffer 36 can avoid the transfer arm 16 entering into a vertically movable range of the stage 36a (hereinafter referred to as "stage movable range"). In this embodiment, the arm avoiding position is set below the transfer arm 16 entering into the stage movable range. Thereafter, the delivery-side transfer arm 16 carrying the wafer W mounted on the pick 16b is moved into the stage movable range. When the pick 16b is positioned above the stage 36a, the delivery-side transfer arm 16 is stopped (see FIG. 6B).

Figure 6A:
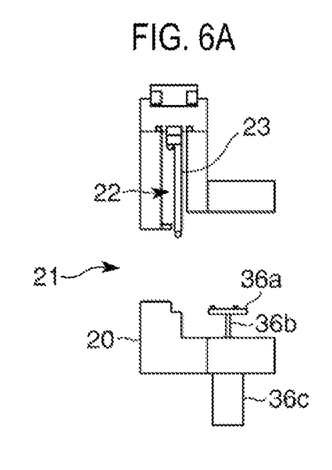
FIGS. 6A to 6H are process diagrams showing a substrate transfer method according to another embodiment.
Figure 6B:
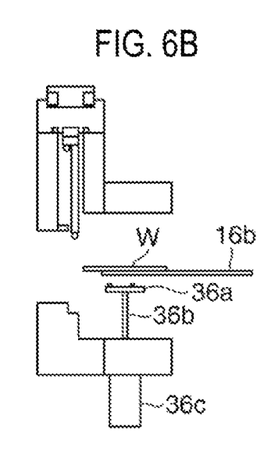

Subsequently, the motor 36c further moves the stage 36a upward. During the upward movement of the stage 36a, the respective pins 36d are brought into contact with the wafer W from below. The stage 36a continues to move upward. Thus, the respective pins 36d move upward while supporting the wafer W, whereby the wafer W is moved away from the pick 16b. As a result, the pick 16b of the delivery-side transfer arm 16 delivers the wafer W to the stage 36a. In this embodiment, a position where the stage 36a and the pick 16b are located when the respective pins 36d are brought into contact with the wafer W from below will be referred to as "wafer delivery position."

Figure 6C:
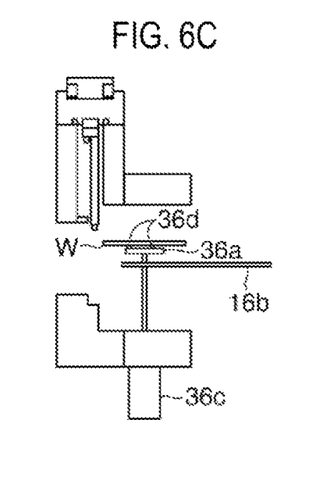
Figure 6D:
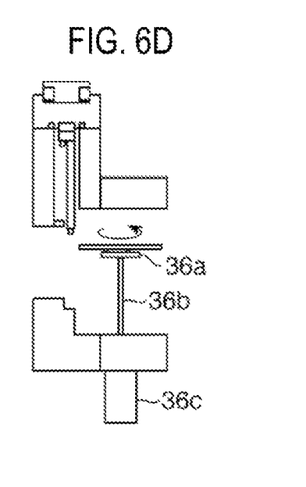

Thereafter, when the stage 36a is moved to a position located above the pick 16b of the delivery-side transfer arm 16 and spaced apart a predetermined distance from the delivery-side transfer arm 16, the motor 36c stops the upward movement of the stage 36a (see FIG. 6C). Subsequently, the delivery-side transfer arm 16 is moved out of the stage movable range. At this time, the motor 36c rotates the shaft 36b, whereby the stage 36a and the wafer W mounted on the stage 36a are rotated by a desired rotation angle within a horizontal plane (see FIG. 6D).

Then, the reception-side transfer arm 16 enters into the stage movable range. The reception-side transfer arm 16 is stopped when the pick 16b of the reception-side transfer arm 16 is positioned below the wafer W supported on the respective pins 36d of the stage 36a (see FIG. 6E).

Figure 6E:
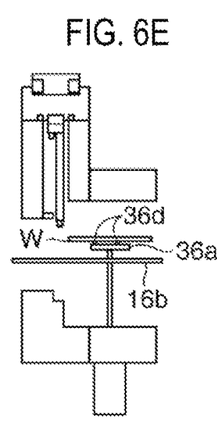

Subsequently, the motor 36c moves the stage 36a downward. During the downward movement of the stage 36a, the pick 16b is brought into contact with the wafer W from below. The stage 36a continues to move downward. Thus, the wafer W is moved away from the respective pins 36d and is mounted on the pick 16b. In this embodiment, the pick 16b of the reception-side transfer arm 16 receives the wafer W from the respective pins 36d at the wafer delivery position.

Figure 6F:
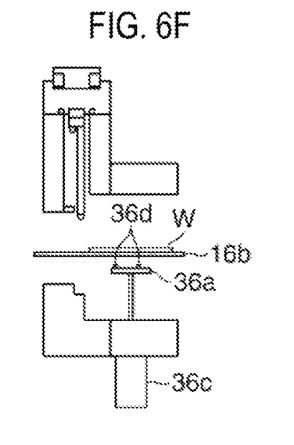
Figure 6G:
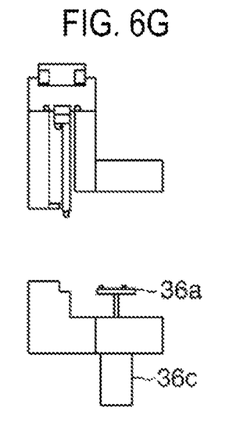
Figure 6H:
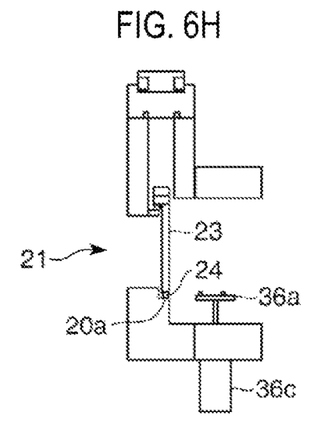

Thereafter, when the stage 36a is moved to the arm avoiding position, the motor 36c stops the downward movement of the stage 36a (see FIG. 6F). Subsequently, the reception-side transfer arm 16 is moved out of the stage movable range. The motor 36c further moves the stage 36a downward (see FIG. 6G). Thus, the transfer process of this embodiment is completed.

In some embodiments, the gate valve 23 may be moved downward after the reception-side transfer arm 16 moves out of the stage movable range and after the motor 36c further moves the stage 36a downward. The downward movement of the gate valve 23 may be stopped after the gate valve 23 is moved to a position (the closing position) where the seal ring 24 installed in the lower end 23b of the gate valve 23 is brought into contact with the stepped surface 20a of the lower frame 20, thereby closing the connection path 21 (see FIG. 6H).

According to the substrate transfer method shown in FIG. 6, the up-down movement of the stage 36a, the expansion/contraction operations of the delivery-side transfer arm 16 and the reception-side transfer arm 16 and the rotation of the stage 36a within the horizontal plane are performed in a cooperation relationship. This makes it possible to rotate the wafer W by a desired rotation angle within the horizontal plane when transferring the wafer W between two adjacent transfer modules 12. That is to say, the transfer of the wafer W and the rotation of the wafer W within the horizontal plane can be performed through a series of consecutive processes. It is therefore possible to improve throughput of a process for the wafer W, e.g., a manufacturing process of an electronic device.

While some embodiments of the present disclosure have been described above, the present disclosure is not limited to the aforementioned embodiments.

The above embodiments of the present disclosure may be implemented by applying a storage medium storing program codes of software for realizing the functions of the above embodiments to a computer, e.g., a control unit of the substrate processing system 10, and allowing a CPU (Central Processing Unit) of the control unit to read out and execute the program codes stored in the storage medium.

In this case, the program codes read out from the storage medium realize the functions of the above embodiments. Accordingly, the program codes and the storage medium storing the program codes constitute the present disclosure.

Examples of the storage medium for supplying the program codes may include, e.g., a RAM, an NVRAM, a floppy (registered trademark) disk, a hard disk, an optical disk such as a magneto-optical disk, a CD-ROM, a CD-R, a CD-RW, a DVD (a DVD-ROM, a DVD-RAM, a DVD-RW or a DVD+RW) or the like, a magnetic tape, a nonvolatile memory card, or other storage medium such as a ROM or the like which can store the program codes. Alternatively, the program codes may be supplied to the control unit by downloading the same from a computer or a database (not shown) connected to the Internet, a commercial network, a local area network or the like.

While the functions of the above embodiments has been implemented by executing the program codes read out with the control unit, the present disclosure is not limited thereto. As an example, some or all of actual processes may be performed pursuant to the instructions of the program codes by an OS (Operating System) operating on the CPU (Central Processing Unit) such that the functions of the above embodiments are implemented.

In some embodiments, after the program codes read out from the storage medium are written into a memory of a function expansion board inserted into the control unit or a memory of a function expansion unit connected to the control unit, some or all of actual processes may be performed pursuant to the instructions of the program codes by a CPU or the like of the function expansion board or the function expansion unit such that the functions of the above embodiments are implemented.

The form of the program codes may be composed of object codes, program codes executed by an interpreter, script data supplied to an OS, or other forms.

According to the present disclosure, a substrate holding mechanism which holds a substrate is attached to a partition valve which can move into and out of a connection path interconnecting two adjacent transfer chambers. Thus, the substrate holding mechanism can be moved by moving the partition valve. Since the transfer of the substrate between two adjacent transfer chambers is performed by cooperation between a movement of the substrate holding mechanism and transfer operations of a transfer mechanism, it is possible to eliminate the need to install a moving mechanism for the substrate holding mechanism in addition to a moving mechanism for the partition valve. This makes it possible to simplify a structure of the substrate processing system.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing system, comprising:
at least two transfer chambers disposed adjacent each other, each of which including a transfer mechanism configured to transfer a substrate;
at least one process chamber connected to each of the at least two transfer chambers, and configured to perform a process on the substrate loaded into the at least one process chamber;
a gate valve configured to move into and out of a connection path interconnecting the at least two transfer chambers and configured to separate the at least two transfer chambers from each other; and
a substrate holding mechanism directly attached to the gate valve and configured to hold the substrate, having an L-like shape when seen in a side view, and including two arms horizontally protruding toward an interior of one of the at least two transfer chambers, wherein the substrate holding mechanism and the gate valve move as a unit.

2. The system of claim 1, wherein the substrate holding mechanism is configured to support a bottom of the substrate.

3. The system of claim 1, wherein the substrate holding mechanism is configured to support the substrate in a suspended state.

4. The system of claim 1, wherein the substrate holding mechanism is moved among an avoiding position where the substrate holding mechanism avoids the transfer mechanism entering into a movement range of the substrate holding mechanism, a delivery position where the substrate is transferred between the transfer mechanism and the substrate holding mechanism, and a closing position where the gate valve closes the connection path.

5. A gate valve for use in a substrate processing system which includes at least two transfer chambers disposed adjacent each other and at least one process chamber connected to each of the at least two transfer chambers, and configured to perform a process on a substrate loaded into the at least one process chamber, each of the at least two transfer chambers including a transfer mechanism configured to transfer the substrate,
the gate valve configured to move into and out of a connection path interconnecting the at least two transfer chambers and configured to separate the at least two transfer chambers from each other,
the gate valve comprising:
a substrate holding mechanism directly attached to the gate valve, and configured to hold the substrate, having an L-like shape when seen in a side view, and including two arms horizontally protruding toward an interior of one of the at least two transfer chambers, wherein the substrate holding mechanism and the gate valve move as a unit.

6. A substrate transfer method for use in a substrate processing system,
wherein the substrate processing system includes:
at least two transfer chambers disposed adjacent each other, each of which including a transfer mechanism configured to transfer a substrate;
at least one process chamber connected to each of the at least two transfer chambers, and configured to perform a process on the substrate loaded into the at least one process chamber;
a gate valve configured to move into or out of a connection path interconnecting the at least two transfer chambers and configured to separate the at least two transfer chambers from each other; and
a substrate holding mechanism directly attached to the gate valve and configured to hold the substrate having an L-like shape when seen in a side view, and including two arms horizontally protruding toward an interior of one of the at least two transfer chambers, wherein the substrate holding mechanism and the gate valve move as a unit,
the method comprising:
moving the gate valve out of the connection path;
transferring the substrate between the at least two transfer chambers disposed adjacent to each other by cooperation between a movement of the substrate holding mechanism along with the movement of the gate valve and a transfer operation of the transfer mechanism; and
moving the gate valve into the connection path.

* * * * *